United States Patent
Levy et al.

(10) Patent No.: US 10,900,935 B2
(45) Date of Patent: Jan. 26, 2021

(54) ELECTRICAL MEASUREMENT CIRCUIT, GAS DETECTOR AND METHOD FOR MEASURING A GAS CONCENTRATION

(71) Applicant: OFFICE NATIONAL D'ETUDES ET DE RECHERCHES AÉROSPATIALES, Palaiseau (FR)

(72) Inventors: Raphael Levy, Paris (FR); Guillaume Aoust, Arcons d'Allier (FR); Béatrice Verlhac, Issy les Moulineaux (FR); Jean Guerard, Juvisy-sur-Orge (FR); Olivier Le Traon, Vauhallan (FR); Vincent Gaudineau, Palaiseau (FR)

(73) Assignee: OFFICE NATIONAL D'ETUDES ET DE RECHERCHES AÉROSPATIALES, Palaiseau (FR)

( * ) Notice: Subject to any disclaimer, the term of this patent is extended or adjusted under 35 U.S.C. 154(b) by 49 days.

(21) Appl. No.: 16/339,552

(22) PCT Filed: Sep. 26, 2017

(86) PCT No.: PCT/FR2017/052583
§ 371 (c)(1),
(2) Date: Apr. 4, 2019

(87) PCT Pub. No.: WO2018/065696
PCT Pub. Date: Apr. 12, 2018

(65) Prior Publication Data
US 2020/0041462 A1    Feb. 6, 2020

(30) Foreign Application Priority Data
Oct. 4, 2016    (FR) ..................... 16 59557

(51) Int. Cl.
| G01N 21/17 | (2006.01) |
| G01N 29/24 | (2006.01) |
| G01N 29/34 | (2006.01) |

(52) U.S. Cl.
CPC ......... *G01N 29/34* (2013.01); *G01N 21/1702* (2013.01); *G01N 29/2425* (2013.01); *G01N 2291/014* (2013.01); *G01N 2291/021* (2013.01)

(58) Field of Classification Search
CPC ............ G01N 29/022; G01N 29/2425; G01N 29/2418; G01N 29/34; G01N 29/323;
(Continued)

(56) References Cited

U.S. PATENT DOCUMENTS 3,490,056 A * 1/1970 Milton .................... H01L 29/00
                                                            333/186
4,137,511 A * 1/1979 Jones ..................... H03H 9/462
                                                            333/186
(Continued)

FOREIGN PATENT DOCUMENTS

WO    2009/109897 A1    9/2009

OTHER PUBLICATIONS

International Search Report, dated Nov. 21, 2017, from corresponding PCT application No. PCT/FR2017/052583.

*Primary Examiner* — Jacques M Saint Surin
(74) *Attorney, Agent, or Firm* — Nixon & Vanderhye

(57) ABSTRACT

An electric measurement circuit possesses an electrical reaction leg for forming an oscillator from a resonator, and furthermore possesses a measurement leg the input of which is supplied by the electrical reaction leg. The measurement leg contains an adjustable phase shifter so that an additional excitation force that is applied to the resonator in the measurement leg can be adjusted in phase quadrature with (Continued)

respect to an excitation force that is applied to the resonator in the electrical reaction leg. Such an electrical measurement circuit is particularly suitable for forming a photoacoustic gas detector.

19 Claims, 5 Drawing Sheets

(58) Field of Classification Search
CPC .......... G01N 21/1702; G01N 29/4436; G01N 29/326; G01N 29/36; G01N 29/036; G01N 2291/021; G01N 2291/0427; G01N 2291/014; G01N 2021/1708; G01N 2291/0289; G01N 2021/1704; G01N 2291/01; G01N 2291/02809; G01N 2291/101; G01H 3/12; G01H 9/2469; B06B 1/0261; B06B 2201/52; H03B 5/326; H03H 9/2468

USPC .......................................................... 73/579
See application file for complete search history.

(56) References Cited

U.S. PATENT DOCUMENTS

| | | | |
|---|---|---|---|
| 6,424,074 B2 * | 7/2002 | Nguyen | H03H 3/0078 |
| | | | 310/309 |
| 7,245,380 B2 | 7/2007 | Kosterev | |
| 10,175,044 B2 * | 1/2019 | Haneda | G01C 19/5614 |
| 10,254,115 B2 * | 4/2019 | Haneda | G01C 19/5614 |
| 2011/0001964 A1 | 1/2011 | Kalkman et al. | |
| 2011/0179872 A1 | 7/2011 | Kaino et al. | |
| 2011/0290002 A1 * | 12/2011 | Heidrich | G01N 21/1702 |
| | | | 73/24.02 |
| 2019/0017966 A1 * | 1/2019 | Csutak | G01N 29/46 |
| 2019/0212259 A1 * | 7/2019 | Carbonelli | G01N 29/2418 |

* cited by examiner

ELECTRICAL MEASUREMENT CIRCUIT, GAS DETECTOR AND METHOD FOR MEASURING A GAS CONCENTRATION

The present invention relates to an electrical measurement circuit, a gas detector and a method for measuring a gas concentration. In particular, it relates to a gas detector and a method for measurement of a gas concentration using photo-acoustic effect.

The photo-acoustic effect is based on the capacity of a gas to absorb electromagnetic radiation, which may be for example produced by a laser, and to dissipate the energy thus absorbed in the form of heat. When the absorption of the electromagnetic radiation is intermittent and periodic, the heat emission leads to an acoustic wave whose intensity is representative of the gas concentration.

It is then known to detect the intensity of the acoustic wave by using an electromechanical resonator which is sensitive to this acoustic wave and which is arranged near the path of the electromagnetic radiation in the gas. An electromechanical resonator which is commonly used for this purpose is for example a quartz tuning fork, arranged for receiving the acoustic wave on at least one of the tines thereof. The power the electromagnetic radiation is then modulated at the vibrational resonant frequency of the electromechanical resonator, by an external modulation signal, or else the wavelength of the electromagnetic radiation is modulated by an external modulation signal at half the vibrational resonant frequency of the resonator, as described in patent U.S. Pat. No. 7,245,380. Because of the excitation of the resonator which is thus produced in one of its resonant vibration modes, detection of the intensity of the acoustic wave through the amplitude of vibration of the resonator has a high sensitivity. Finally, the vibration amplitude of the resonator is measured by using a synchronous detection between a response signal from the resonator and the external modulation signal of the electromagnetic radiation. FIG. 5 shows the architecture of such gas detector known from the prior art. It involves an open-loop architecture which is fed at input by the external modulation signal, and which comprises in order: a modulator 51 noted MOD, a laser unit 52 for producing an electromagnetic radiation beam FX which is directed towards the gas, and an electro-mechanical resonator 1 noted RESON which is sensitive to the acoustic wave and produces a response signal representative of the intensity of this acoustic wave. The synchronous detector 30, noted SYNCH DETECT, simultaneously receives the external modulation signal and the response signal, and generates a continuous measurement signal whose amplitude is representative of the concentration of the gas which absorbs the radiation from the beam FX.

But, in order to measure the concentration of the gas using this principle, it is necessary that the intended acquisition time for a measurement be greater than the time necessary for the vibration to set in the resonator, where this latter time is equal to $Q/f_r$, where $Q$ and $f_r$ are respectively the quality factor and the vibrational resonant frequency of the resonator. Hence, in order to obtain a high detection sensitivity, the resonator is selected for having a quality-factor Q which is high, and a vibrational resonant frequency value thereof $f_r$ which is low. The acquisition time for a measurement is therefore long. Furthermore, given that the excitation of the resonator is not slaved to its vibrational resonant frequency, and since this varies depending on external conditions such as ambient pressure and temperature, it is necessary to repeat several acquisitions for one measurement with varying the frequency of the external modulation signal until it coincides with the vibrational resonant frequency of the resonator. The measurement time is thus multiplied by the number of acquisitions which are carried out, leading to a total length for a single measurement which can be of order or more than several tens of seconds. Such a length can be incompatible with practical requirements, in particular when the ambient pressure and temperature may vary quickly, or when the application requires a quick detection, for example for detecting the presence of a toxic gas, or even when the detector is used cyclically for several different gases.

Furthermore, measuring a magnetic field by using an electromechanical resonator, for example a vibrating beam which is incorporated in an oscillator, is also known. In this way, the excitation frequency of the resonator is slaved to the resonant frequency of the oscillator. The resonator is further subject to a Lorentz force which results from the interaction of the magnetic field to be measured with an electric current flowing in this resonator. This current is obtained from an excitation signal of the resonator, by applying a fixed phase shift and possible amplification. Such a principle for magnetic field measurement is described in the article by Li, M., Sonmezoglu, S. and Horsley, D., "Extended bandwidth Lorentz force magnetometer based on quadrature frequency modulation," Journal of Microelectromechanical Systems, 2015, 24(2), pp. 333-342. The value of the magnetic field is then deduced from an offset of the resonant frequency of the oscillator, which is produced by the Lorentz force. Given that this offset of the resonant frequency appears immediately after application of the magnetic field, the duration of a measurement is greatly reduced compared to the previous case of the measurement of a vibration amplitude by synchronous detection. But the measurement electrical circuit of such a magnetometer is not suited to interactions between the parameter to be measured and the resonator which generate phase shifts of unknown value in an additional excitation force which results from a nonzero value of the parameter to be measured and is applied to the resonator.

Document WO 2009/109897 relates to a photo-acoustic effect gas detector where the physical parameter which is measured is a phase shift due to the perturbation effect which a measurement branch creates onto an oscillator. Adjusting an alignment between a laser beam which is used for producing the photo-acoustic effect and a tuning fork which constitutes an electromechanical resonator is indicated.

Finally, document US 2011/0179872 relates to an amplitude detection electrical circuit which is intended to be incorporated in a sensor for a physical quantity, such as an angular velocity sensor.

Starting from this situation, an object of the present invention consists in performing measurements, in particular measurements of a concentration of a gas, with an individual measurement time which is short.

Another object of the invention consists in obtaining measurement results which are independent of, or slightly dependent on, external conditions such as ambient pressure and temperature.

Finally, an additional object of the invention consists in providing a gas detector which is low-cost and small-volume.

To achieve at least one of these objects or others, a first aspect of the invention proposes an electrical measurement circuit which comprises:

an electromechanical resonator;

a feedback electrical branch, having an input which is connected to a detection terminal of the resonator for receiving a response signal from this resonator, and an output which is connected to an excitation terminal of the resonator for applying an excitation force to the resonator, so that the resonator and the feedback electrical branch form at least a part of an oscillator operating at a resonant frequency;

a frequency measurement device which is connected to the oscillator so as to measure the resonant frequency; and a measurement branch, having an input which is connected to the output of the feedback electrical branch, and a modulation output which is adapted for sending a modulation signal to an external device, depending on an excitation signal which exists at the output of the feedback electrical branch.

Thus, when the external device is adapted for applying an additional excitation force to the resonator, in addition to the excitation force applied by the feedback electrical branch, then an offset of the resonant frequency, which is detected by means of the frequency measurement device, and which results from the additional excitation force, constitutes a measurement of a parameter of the external device.

According to the invention, the measurement branch comprises an adjustable phase shifter which is arranged between the input and the modulation output of this measurement branch, so that a phase shift of the additional excitation force which is applied by the external device to the resonator is tunable. Thus the additional excitation force can be placed in phase quadrature relative to the excitation force which is supplied by the feedback electrical branch.

Thanks to using the adjustable phase shifter, the electrical measurement circuit of the invention is adapted to arbitrary phase shifts introduced by interactions between the parameter to be measured of the external device and the resonator. Indeed, with the phase shifter, the electrical measurement circuit can be individually adapted to each external device which produces the interaction between the parameter to be measured and the resonator.

Furthermore, the electrical measurement circuit of the invention has a double feedback loop architecture: the electrical feedback loop forms a first loop with the resonator, and the measurement branch forms a second loop with the external device and the resonator. Such architecture ensures that the frequency of the modulation signal is slaved to the resonant frequency of the oscillator. In this way, the response of a detector which incorporates the circuit is the offset of the resonant frequency, and it instantly or nearly instantly reproduces variations of the parameter to be measured. Using the electrical measurement circuit of the invention, measurements can be made with very short individual acquisition times. The detector is then adapted to applications which require rapid measurements, such as applications for which external or ambient conditions could vary, or for applications for detection and concentration measurement of a toxic gas, or also for applications relating to several different gases which are subject to measurements performed cyclically one after the other.

Finally, an electronic measurement circuit according to the invention can be implemented at low-cost, by using components mass-produced as integrated circuits and microelectromechanical systems, designated by the acronym MEMS. In particular, the resonator may be of the vibrating quartz element type, for example the quartz tuning fork type, or of the vibrating silicon element type, for example the silicon tuning fork type.

In alternate embodiments of the invention, the feedback electric branch may comprise an amplifier and a phase shifter which are combined in series, or may comprise a phase-locked loop assembly.

Advantageously, the measurement branch may be adapted for reversibly applying an additional phase shift of pi, in additional to the phase shift which is tunable by means of the adjustable phase shifter. Thus, the offset of the resonant frequency which constitutes the measurement of the parameter of the external device can be equal to half of the difference between two values which are measured for the resonant frequency with and without, respectively, the additional phase shift equal to pi. In this way, the influence of external conditions such as ambient pressure and temperature on the measurement results is eliminated to first-order.

Alternatively, to more accurately eliminate the influence of external or ambient conditions onto the measurement results, the electrical measurement circuit may further comprise:

a reference electromechanical resonator; and another feedback electrical branch, having an input which is connected to a detection terminal of the reference resonator for receiving a response signal from this reference resonator, and an output which is connected to an excitation terminal of the reference resonator for applying another excitation force to the reference resonator, so that the reference resonator and the so-called another feedback electrical branch form a reference oscillator operating at another resonant frequency, called reference frequency, independently of the oscillator which is connected to the measurement branch.

In this case, the measurement electrical circuit is further adapted for measuring the reference frequency separately from the resonant frequency of the oscillator which is connected to the measurement branch. Then, the offset of the resonant frequency which constitutes the measurement of the parameter of the external device corresponds to a difference between the resonant frequency which is measured for the oscillator connected to the measurement branch and the reference frequency.

A second aspect of the invention proposes a gas detector which comprises:

an electrical measurement circuit, which complies with the first aspect of the invention, and which could have the improvements indicated above; and a modulatable laser constituting the external device, with the modulation output of the measurement branch which is connected to a modulation input of the modulatable laser, and this modulatable laser being oriented so that a gas which would have an absorption line corresponding to a wavelength of the modulatable laser and which would receive a radiation beam originating from this modulatable laser, produces an acoustic wave and this acoustic wave produces the additional excitation force onto the resonator.

For such gas detector, the parameter which is measured through the offset of the resonant frequency is a concentration of the gas which has an absorption line at the wavelength of the modulatable laser.

In such gas detector according to the invention, the modulatable laser may be modulatable in wavelength or radiation power, for the radiation beam which originates from this modulatable laser.

Also in a gas detector according to the invention, the resonator may comprise a tuning fork, and the modulatable laser may be oriented so that the radiation beam which originates from the modulatable laser is perpendicular to the two tines of the tuning fork. The radiation beam may thus pass between the two tines of the tuning fork in a plane of symmetry of the tuning fork, or else pass on one side of one of the two tines of the tuning fork which is opposite from the other tine.

Finally, a third aspect of the invention proposes a method for measurement of a concentration of a gas, which comprises the following steps:

/1/ selecting a gas detector which complies with the second aspect of the invention, and for which a wavelength of the modulatable laser corresponds to an absorption line of the gas;

/2/ placing the gas detector so that the radiation beam which originates from the modulatable laser passes through a zone which could contain a quantity of the gas;

/3/ adjusting the adjustable phase shifter of the measurement branch so that the additional excitation force applied by the external device to the resonator is in phase quadrature relative to the excitation force which is applied by the feedback electric branch;

/4/ measuring an offset of the resonant frequency of the oscillator, resulting from the additional excitation force; and /5/ deducing the value of the gas concentration from the measured offset of the resonant frequency.

The value of the gas concentration may be deduced from the offset of the resonant frequency, in step /5/, by using the formula:

$$C_{gas} = [3 \cdot Q \cdot N_x \cdot V_x / (4 \cdot \beta \cdot f_r)] \cdot \Delta f_r$$

Where $Q$ and $f_r$ are respectively a quality factor and a vibrational resonant frequency of the electromechanical resonator, $N_x$ is a piezoelectric conversion factor of this electromechanical resonator, $V_x$ is an excitation voltage amplitude of the electromagnetic resonator, and $\beta$ is a constant which is independent of the concentration of the gas.

In specific implementations of the invention method, step /3/ may comprise the following sub-steps:

measuring in real time a frequency of the oscillator during an operation of the gas detector; and setting the adjustable phase shifter of the measurement branch so that this frequency of the oscillator as measured is maximum.

Finally, when the resonator comprises a tuning fork, the adjustable phase shifter may be set in step /3/ to produce a phase shift which is equal to:

$$\frac{\pi}{2} - \text{Arctan}\,(2\pi f_r \tau_{V-T}) + \text{Arctan}\left(\frac{\int_{-\frac{l}{2}}^{\frac{l}{2}}\left[Y_0\left(\frac{2\pi f_r}{c}r_{in}\right) - Y_0\left(\frac{2\pi f_r}{c}r_{ext}\right)\right]dz}{\int_{-\frac{l}{2}}^{\frac{l}{2}}\left[J_0\left(\frac{2\pi f_r}{c}r_{in}\right) - J_0\left(\frac{2\pi f_r}{c}r_{ext}\right)\right]dz}\right)$$

where $r_{in} = \left[\left(\frac{L}{2}\right)^2 + (z-H)^2\right]^{\frac{1}{2}}$ and $r_{ext} = \left[\left(\frac{L}{2}+e\right)^2 + (z-H)^2\right]^{\frac{1}{2}}$ and where Oz is an axis parallel to a longitudinal direction of the tines of the tuning fork with an origin which is located at a base of the tines, H is a first distance measured parallel to the axis Oz between the base of the tines of the tuning fork and a center of the radiation beam which originates from the modulatable laser, L is a second distance measured perpendicularly to the Oz axis between the center of the radiation beam and the tuning fork, e is a thickness of the tines of the tuning fork measured parallel to the second distance L, c is a propagation speed of sound in the gas, $f_r$ is again the vibrational resonant frequency of the electromechanical resonator, $\tau_{V-T}$ is a relaxation time of the gas, and $J_0$ and $Y_0$ are first-order Bessel functions of respectively the first and second kind.

Other particulars and advantages of the present invention will appear in the following description of non-limiting implementation examples with reference to the attached drawings, in which:

FIG. 1 is an overall diagram of a gas detector complying with the invention;

FIG. 2 corresponds to FIG. 1 for an alternative implementation of a part of the gas detector;

Figure 3A:
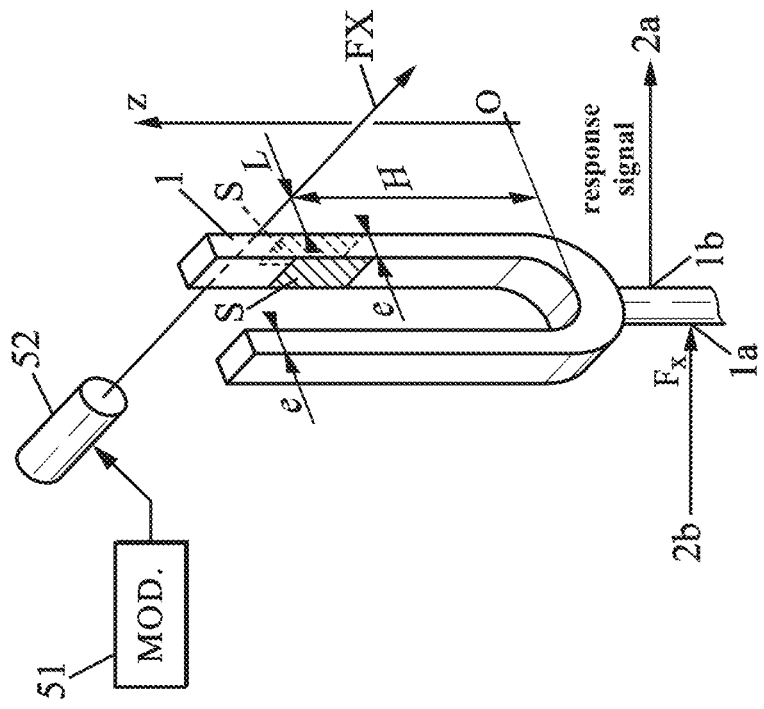
FIGS. 3a and 3b represent two alternative arrangements of an external device and an electromechanical resonator, which are parts of the gas detector of FIG. 1.
Figure 3B:
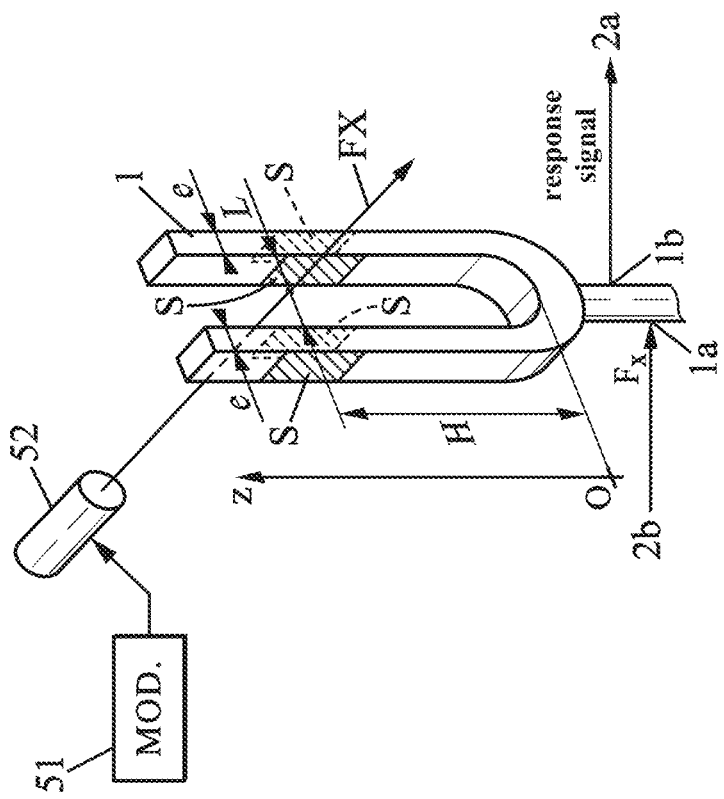

Identical references which are indicated in several figures designate identical elements or elements with identical functions. Furthermore, for reasons of clarity, dimensions of elements or parts of elements which are shown in FIGS. 3a and 3b do not correspond either to actual dimensions nor to actual ratios of dimensions.

Figure 1:
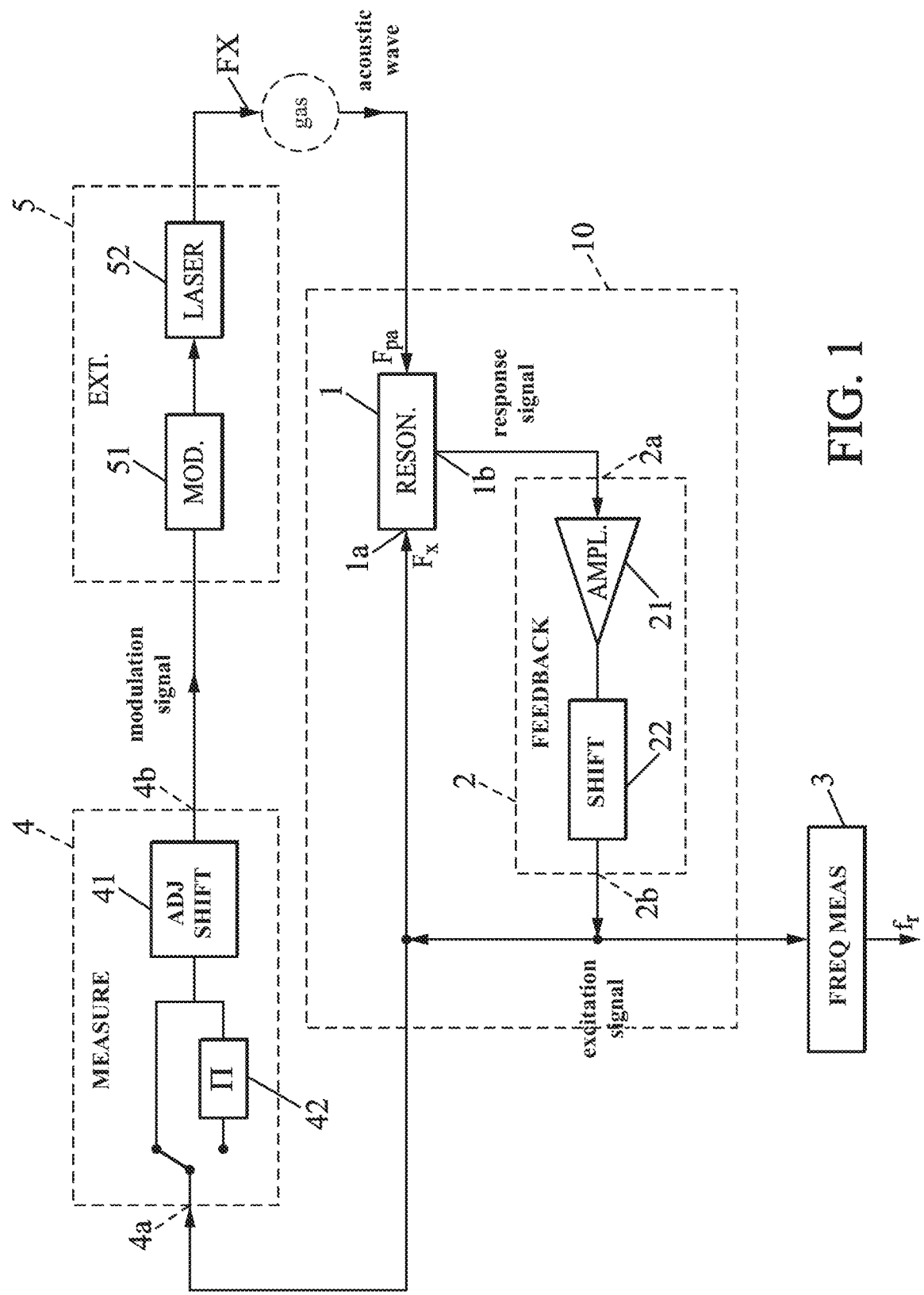

With reference to FIG. 1, an oscillator 10 comprises an electromechanical resonator 1, noted RESON, and a feedback electrical branch 2 noted FEEDBACK. To this end, an input 2a of the feedback branch 2 is connected to a detection terminal 1b of the resonator 1, in order to receive a response signal therefrom, and an output 2b of the feedback branch 2 is connected to an excitation terminal 1a of the resonator 1 to apply an excitation force $F_x$ to the resonator 1. The excitation 1a and detection 1b terminals of the resonator 1 are arranged thereon in a way which is known to the person skilled in the art, and which depends on the type and model of this resonator. More precisely, the feedback branch 2 produces an excitation signal at the output 2b thereof which results in the excitation force $F_x$ when the excitation signal is applied to the excitation terminal 1a of the resonator 1.

The feedback electrical branch 2 may be comprised of an amplifier 21 noted AMPL, and a phase shifter 22 noted SHIFT, which are connected in series. Both Barkhausen criteria for oscillation at a resonant frequency $f_r$ can be satisfied, depending on the characteristics of the resonator 1, with such an implementation of the feedback branch 2.

Figure 2:
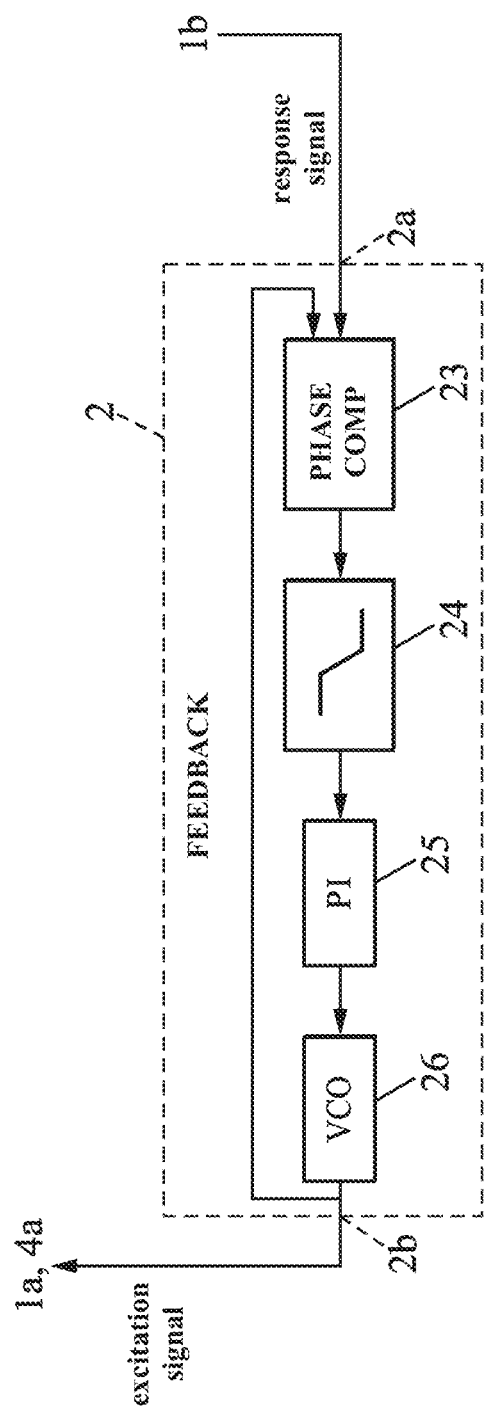

According to an alternative implementation which is shown by FIG. 2, the feedback electrical branch 2 may be comprised phase-locked loop. Such loop comprises, in the signal transmission order: a phase comparator 23, noted PHASE COMP, a low-pass filter 24, a proportional-integral controller 25, noted PI, and a voltage-controlled oscillator 26, noted VCO. The phase comparator 23 receives on input the response signal from the resonator 1 at the same time as the oscillation signal from the voltage-controlled oscillator 26, so that the oscillation frequency of the voltage-controlled oscillator 26 is identical to the resonant frequency $f_r$ of the oscillator 10.

Returning to FIG. 1, reference 3 designates a frequency measurement device, which is noted FREQ MEAS and is arranged for measuring the resonant frequency $f_r$ in real time. For example, the device 3 may be connected to the output 2b of the feedback branch 2 for measuring the frequency of the excitation signal. Several embodiments of the frequency measurement device 3 are well known to the person skilled in the art, so that it is not necessary to describe them again here.

The measurement branch 4, noted MEASURE, with the external device 5, noted EXT., forms an additional excitation branch for the resonator 1, which acts in parallel with the excitation which is directly applied to the resonator 1 by the electrical feedback branch 2. To this end, an input 4a of the measurement branch 4 is connected for receiving the excitation signal which is produced by the feedback branch 2. At the output 4b of the measurement branch 4, this measurement branch 4 produces a modulation signal based on the excitation signal, and this modulation signal is sent to the external device 5. Finally, the external device 5 produces an additional excitation force $F_{pa}$, which is applied to the resonator 1 in addition to the excitation force $F_x$. Because of this architecture of the electric measurement circuit, the additional excitation force $F_{pa}$ is modulated at the frequency of the excitation signal which is produced by the feedback branch 2. In other words, the frequency of the modulation signal which is produced by the measurement branch 4 is slaved to the resonant frequency of the oscillator 10 combined with the measurement branch 4 and the external device 5. As explained later in this description, the additional excitation force $F_{pa}$, which acts onto the resonator 1 in addition to the excitation force $F_x$, causes an offset of the resonant frequency $f_r$ as measured by the device 3. This offset of the resonant frequency $f_r$ is then characteristic of a parameter of the external device 5 and constitutes a quantitative measurement of this parameter.

For use of such a measurement electrical circuit in a gas detector, the external device 5 may be a photo-acoustic effect gas detection cell. The operation of such a detection cell, known before the invention, was reviewed at the beginning of the present description. Such an external device comprises a modulator 51 and a laser unit 52 which are arranged for forming together a modulatable laser. This produces the electromagnetic radiation beam FX which is indicated on FIGS. 3a and 3b, and which can be modulated in power of the radiation or in wavelength of the radiation. When the wavelength is modulated, the modulation signal is obtained from the excitation signal which is produced by the feedback branch 2 by dividing the frequency of this excitation signal in two. The beam FX is then directed to pass near the resonator 1, and the acoustic wave is generated when a gas is present on the path of the beam FX and when this gas absorbs radiation at the wavelength of the beam FX. The acoustic wave next produces the additional excitation force $F_{pa}$ onto the resonator 1, after propagating from the location of the absorption of the electromagnetic radiation by the gas to a surface of the resonator 1 which is sensitive to the acoustic overpressure. In the embodiment of FIGS. 3a and 3b, the resonator 1 is a quartz tuning fork. According to FIG. 3a, the laser beam FX may be directed between the two tines of the tuning fork, in the plane of symmetry of the tuning fork, so that it passes simultaneously at a distance L from each of the two tines. The acoustic wave thus exerts the force $F_{pa}$ on both tines of the tuning fork, simultaneously and symmetrically, with a greater interaction efficiency. In the case of FIG. 3b, the laser beam FX passes outside the tuning fork, at a distance L from one of the two tines. The acoustic wave then essentially only interacts with the tuning fork through this tine. In both cases, L is the propagation distance of the acoustic wave for reaching the resonator 1. This propagation distance generates a phase delay for the additional excitation force $F_{pa}$ compared to the modulation signal.

Returning to FIG. 1, the measurement branch 4 comprises an adjustable phase shifter 41, noted ADJ SHIFT, and, optionally, an additional phase shifter 42 which is noted $\pi$ and connected for being alternately activated or inhibited. When the additional phase shifter 42 is inhibited, only the adjustable phase shifter 41 is effective for the modulation signal relative to the excitation signal. When the additional phase shifter 42 is activated, the phase shift of the modulation signal relative to the excitation signal results from the sum of the respective phase-shifting contributions of the adjustable phase shifter 41 and the additional phase shifter 42. The contribution of the additional phase shifter 42 is then equal to pi ($\pi$).

According to the handbook by T. L. Cottrel et J. McCoubrey and entitled "Molecular Energy Transfer in Gases", Butterworths, London (1961), p. 64, the phase shift specific to the photo-acoustic effect is $\phi_{pa} = \arctan(2\pi \cdot f_r \cdot \tau_{V-T})$. In this formula, $f_r$ designates the modulation frequency of the modulatable laser, which is equal to the resonant frequency of the oscillator 10 completed with the measurement branch 4 and the external device 5, $\tau_{V-T}$ is the relaxation time of the gas through vibration and translation of the molecules or atoms of this gas, and arctan designates the inverse of the tangent function.

Furthermore, an additional phase shift results from the propagation of the acoustic wave between the site of absorption of the electromagnetic radiation of the beam FX by the gas and the resonator 1. For both embodiments of FIGS. 3a and 3b, this additional phase shift results from the propagation of the acoustic wave between the radiation beam FX and the sensitive surfaces S of the tuning fork. It follows that:

$$\phi_{ac} = \text{Arctan}\left( \frac{\int_{-\frac{l}{2}}^{\frac{l}{2}}\left[Y_0\left(\frac{2\pi f_r}{c}r_{in}\right) - Y_0\left(\frac{2\pi f_r}{c}r_{ext}\right)\right]dz}{\int_{-\frac{l}{2}}^{\frac{l}{2}}\left[J_0\left(\frac{2\pi f_r}{c}r_{in}\right) - J_0\left(\frac{2\pi f_r}{c}r_{ext}\right)\right]dz} \right)$$

where $r_{in} = \left[\left(\frac{L}{2}\right)^2 + (z-H)^2\right]^{\frac{1}{2}}$ and $r_{ext} = \left[\left(\frac{L}{2}+e\right)^2 + (z-H)^2\right]^{\frac{1}{2}}$ where Oz is an axis parallel to the longitudinal direction of the tines of the tuning fork with an origin which is located at the base of the tines, H is the distance measured parallel to the axis Oz between the base of the tines of the tuning fork and the center of the radiation beam FX, L is the distance measured perpendicularly to the Oz axis between the center of the radiation beam FX and each of the sensitive surfaces S of the tuning fork which are closest to the radiation beam FX, e is the thickness of the tines of the tuning fork measured parallel to the distance L, c is the propagation speed of sound in the gas, $f_r$ is again the vibrational resonant frequency of the electromechanical resonator, $\tau_{V-T}$ is again the relaxation time of the gas, and $J_0$ and $Y_0$ are first-order Bessel functions of respectively the first and second kind.

The phase shift between the two excitation forces $F_x$ and $F_{pa}$ which are applied simultaneously to the resonator 1 is:

$$\phi_{total} = \phi_{el} + \phi_{pa} + \phi_{ac}$$

where $\phi_{el}$ is the phase delay which is applied by measurement branch 4 to the excitation signal for producing the modulation signal.

The two excitation forces $F_x$ and $F_{pa}$ are therefore in phase quadrature, meaning $\phi_{total} = \pm \pi/2$, when $\phi_{el} + \phi_{pa} + \phi_{ac} = \pm \pi/2$. In particular, for the tuning fork embodiment from FIG. 3a, $F_x$ and $F_{pa}$ are in phase quadrature when:

$$\varphi_{el} =$$

-continued $$\frac{\pi}{2} - \text{Arctan}\ (2\pi f_r \tau_{V-T}) - \text{Arctan}\left(\frac{\int_{-\frac{l}{2}}^{\frac{l}{2}}\left[Y_0\left(\frac{2\pi f_r}{c}r_{in}\right) - Y_0\left(\frac{2\pi f_r}{c}r_{ext}\right)\right]dz}{\int_{-\frac{l}{2}}^{\frac{l}{2}}\left[J_0\left(\frac{2\pi f_r}{c}r_{in}\right) - J_0\left(\frac{2\pi f_r}{c}r_{ext}\right)\right]dz}\right)$$

where $r_{in} = \left[\left(\frac{L}{2}\right)^2 + (z-H)^2\right]^{\frac{1}{2}}$ and $r_{ext} = \left[\left(\frac{L}{2}+e\right)^2 + (z-H)^2\right]^{\frac{1}{2}}$ Then, when the two excitation forces $F_x$ and $F_{pa}$ are in phase quadrature, the phase shift of the sum of the two forces $F_x$ and $F_{pa}$ relative to the force $F_x$ is $\theta = \text{Arctan}(F_{pa}/F_x)$. However, in general, the additional excitation force $F_{pa}$ is much smaller than the excitation force $F_x$ such that $\theta = F_{pa}/F_x$.

Again because the additional excitation force $F_{pa}$ is much smaller than the excitation force $F_x$, the offset $\Delta f_r$ of the resonant frequency $f_r$ caused by the additional excitation force $F_{pa}$ is small, and is equal to $\theta \cdot f_r/(2 \cdot Q)$ according to the oscillator perturbation theory. It then follows that $\Delta f_r = [f_r/(2 \cdot Q)] \cdot F_{pa}/F_x$. To first order, $f_r$ is the resonant frequency of the oscillator 10 in the absence of gas, or else the vibrational resonant frequency of the resonator 1.

Hence at the resonant frequency, $F_x = K \cdot |x|/Q$, where $|x|$ designates the vibrational amplitude of the resonator 1 and K is the stiffness of the resonator 1. It then follows that $\Delta f_r = [f_r/(2 \cdot K \cdot |x|)] \cdot F_{pa}$. By assuming that the acoustic wave produces the additional excitation force $F_{pa}$ at one or both of the tines of the tuning fork which form the resonator 1, the preceding formula for the resonant frequency offset becomes: $\Delta f_r = [4 \cdot f_r/(3 \cdot K \cdot |x|)] \cdot F_{pa}$.

At the resonant frequency, the voltage amplitude $V_x$ of the excitation signal is equal to $K \cdot |x|/(N_x \cdot Q) = F_x/N_x$, where $N_x$ is a piezoelectric conversion factor of the resonator 1. Then: $\Delta f_r = [4 \cdot f_r/(3 \cdot N_x \cdot Q \cdot V_x)] \cdot F_{pa}$.

Here, the additional excitation force $F_{pa}$ which is exerted on the resonator 1 by the acoustic wave is proportional to the concentration of the gas to be detected: $F_{pa} = \beta \cdot C_{gas}$, where $C_{gas}$ is the concentration of the gas and $\beta$ is a number which is independent of the concentration of the gas, but which depends in particular on the effective action surface of the acoustic wave onto the resonator 1 and on the power of the beam FX. It then follows that: $C_{gas} = [3 \cdot Q \cdot N_x \cdot V_x/(4 \cdot \beta \cdot f_r)] \cdot \Delta f_r$.

For a quartz tuning fork which is 3.8 mm long when measured along the Oz axis, with thickness e of the tines equal to 0.600 mm, width of the tines equal to 0.340 mm when measured perpendicularly to the thickness e and to the axis Oz, and 0.310 mm for separation between the tines, the quality factor Q may be equal to 15,400, the vibrational resonant frequency $f_r$ may be equal to 32,762 Hz (Hertz), and the piezoelectric conversion coefficient $N_x$ can be equal to $9 \times 10^{-6}$ C/m (coulomb per meter). The modulatable laser may then have an average power equal to 17 mW, and be purely sinusoidally amplitude-modulated at the frequency $f_r$. The wavelength thereof is then fixed and may correspond to the wavenumber value 6490.05 cm$^{-1}$. When carbon dioxide ($CO_2$) is the gas to be detected at atmospheric pressure, combined with water vapor at 15% concentration, the sound propagation speed is 260 m·s$^{-1}$ and the wavenumber of the carbon dioxide absorption peak is 6490.05 cm$^{-1}$. The voltage amplitude of the excitation signal $V_x$ may be equal to 10 mV, the relaxation time $\tau_{V-T}$ may be equal to 0.1 µs and the number $\beta$ may be equal to $8.1 \times 10^{-13}$ N·mol$^{-1}$·m$^3$ for implementation of the tuning fork corresponding to FIG. 3a.

When the additional phase shifter 42 is inhibited, the adjustable phase shifter 41 is set to produce the phase shift:

$$\frac{\pi}{2} - \text{Arctan}\ (2\pi f_r \tau_{V-T}) + \text{Arctan}\left(\frac{\int_{-\frac{l}{2}}^{\frac{l}{2}}\left[Y_0\left(\frac{2\pi f_r}{c}r_{in}\right) - Y_0\left(\frac{2\pi f_r}{c}r_{ext}\right)\right]dz}{\int_{-\frac{l}{2}}^{\frac{l}{2}}\left[J_0\left(\frac{2\pi f_r}{c}r_{in}\right) - J_0\left(\frac{2\pi f_r}{c}r_{ext}\right)\right]dz}\right)$$

where $r_{in} = \left[\left(\frac{L}{2}\right)^2 + (z-H)^2\right]^{\frac{1}{2}}$ and $r_{ext} = \left[\left(\frac{L}{2}+e\right)^2 + (z-H)^2\right]^{\frac{1}{2}}$ This setting may be performed by numerically calculating the value of the phase shift, meaning by substituting into its formula known values for the vibrational resonant frequency $f_r$ of the resonator 1, the relaxation time $\tau_{V-T}$, the distance L and the acoustic wavelength $\lambda$, with this latter is equal to the propagation speed of sound divided by the frequency $f_r$. The phase shift value thus calculated is next applied to the adjustable phase shifter 41. For example, the vibrational resonant frequency $f_r$ of the tuning fork may again be equal to 32,762 Hz, the relaxation time $\tau_{V-T}$ may be equal to 0.1 µs (microsecond), the acoustic wavelength may be equal to 0.8 cm, and the distance L between the tines of the tuning fork may be equal to 0.155 mm. For these numerical values, a phase shift equal to 0.67 radians to be applied to the adjustable phase shifter 41 is obtained.

Alternatively, the frequency of the oscillator can be measured, for example using a frequency meter-counter. The adjustable phase shifter 41 can then be set empirically so that the frequency of the oscillator is maximal.

Based on this setting of the adjustable phase shifter 41, and when the additional phase shifter 42 is activated, the phase shift which is inserted by the measurement branch 4 becomes $$\varphi_{el} = \frac{\pi}{2} - \text{Arctan}\ (2\pi f_r \tau_{V-T}) -$$

$$\text{Arctan}\left(\frac{\int_{-\frac{l}{2}}^{\frac{l}{2}}\left[Y_0\left(\frac{2\pi f_r}{c}r_{in}\right) - Y_0\left(\frac{2\pi f_r}{c}r_{ext}\right)\right]dz}{\int_{-\frac{l}{2}}^{\frac{l}{2}}\left[J_0\left(\frac{2\pi f_r}{c}r_{in}\right) - J_0\left(\frac{2\pi f_r}{c}r_{ext}\right)\right]dz}\right) + \pi$$

where $r_{in} = \left[\left(\frac{L}{2}\right)^2 + (z-H)^2\right]^{\frac{1}{2}}$ and $r_{ext} = \left[\left(\frac{L}{2}+e\right)^2 + (z-H)^2\right]^{\frac{1}{2}}$ It should be noted that the additional excitation force $F_{pa}$ is again in phase quadrature with the excitation force $F_x$. The phase shift of pi radians that is added by the additional phase shifter 42 has the effect of inverting the sign of the additional excitation force $F_{pa}$, and therefore also inverting the sign of the phase shift $\theta$ of the sum of the two excitation forces $F_x$ and $F_{pa}$ compared to the excitation force $F_x$. In other words, the effective phase shift which occurs in the oscillator 10 combined with the measurement branch 4 and the external device 5 is opposed to that which exists when the additional phase shifter 42 is inhibited. Thus, for one and same gas concentration, activation of the additional phase shifter 42 changes the offset $\Delta f_r$ into its opposite $-\Delta f_r$. Consequently, calculating half of the difference of the two resonant frequencies $f_r$ which are measured by the device 3 respectively when inhibiting and when activating the additional phase shifter 42, provides the numerical value of the offset $\Delta f_r$. With this method, it is possible to overcome additive parasitic contributions which are due to variations of external conditions such as variations of ambient pressure and temperature, in the apparent offset $\Delta f_r$ which would be calculated relative to a fixed value used for the resonant frequency $f_r$.

Figure 4:
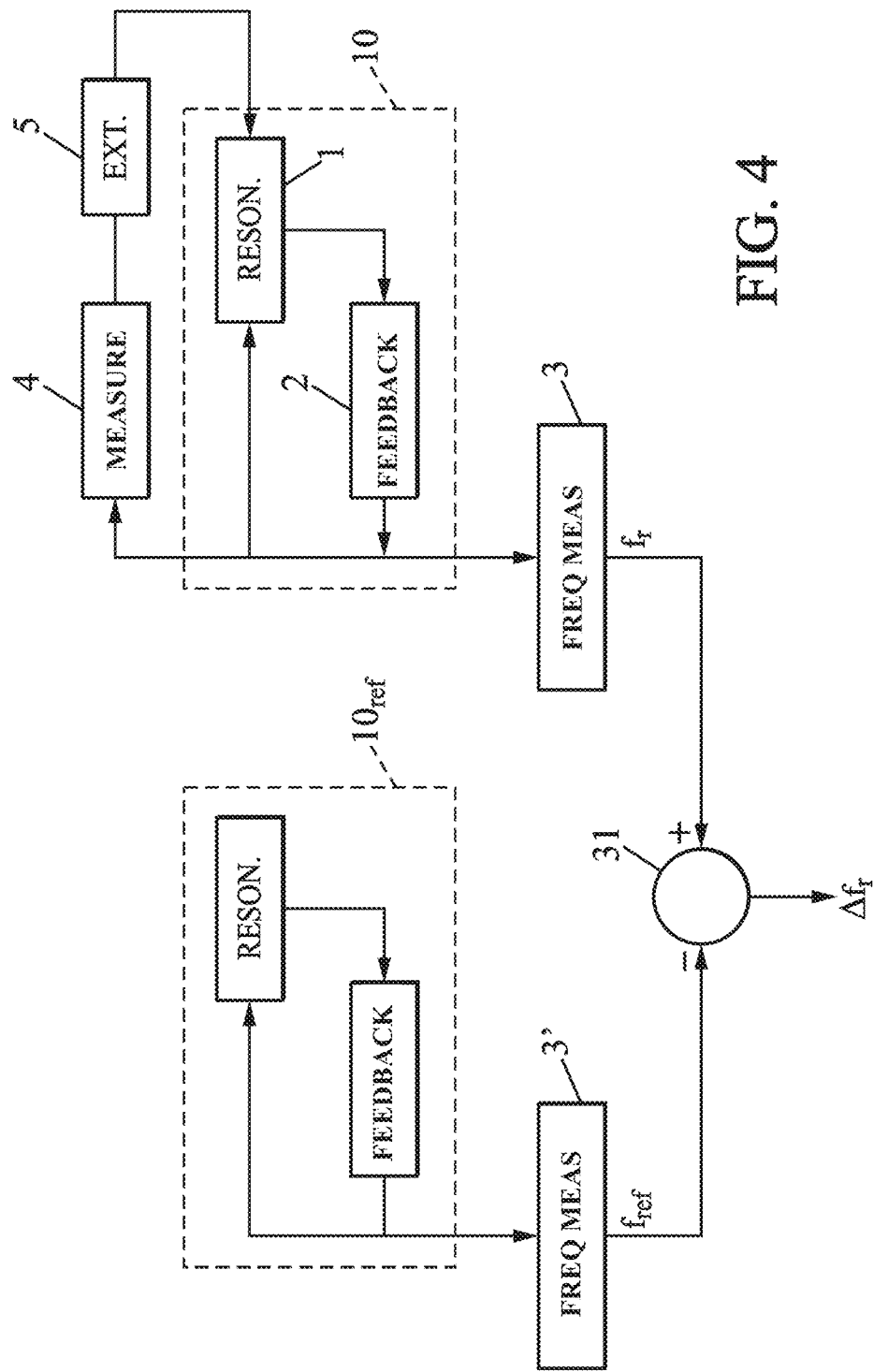
FIG. 4 is an overall diagram of a gas detector complying with an improvement of the invention.
Figure 5:
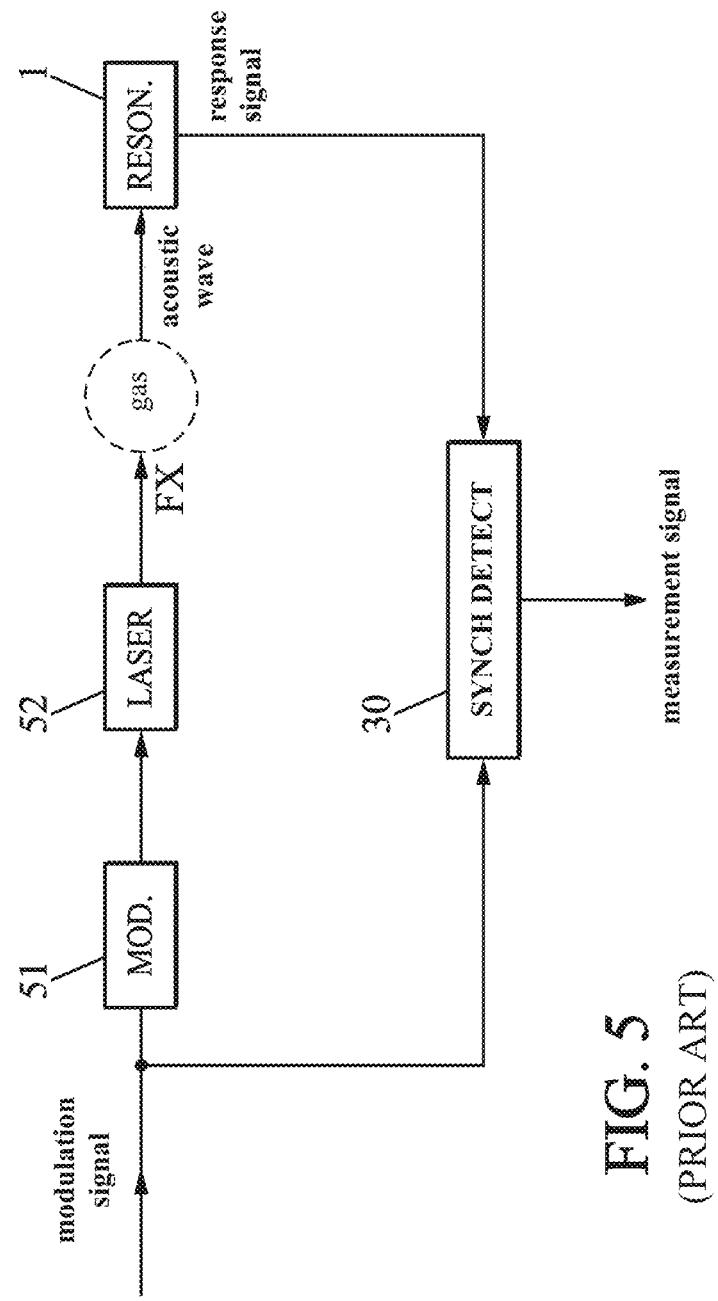
FIG. 5, already described, is an overall diagram of a gas detector such as known before the invention.

FIG. 4 shows another way to overcome variations of external conditions such as ambient pressure and temperature, for the gas concentration result which is obtained. The right part of FIG. 4 identically repeats the assembly from FIG. 1 without the additional phase shifter 42. The oscillator 10 is identically duplicated, for forming a reference oscillator $10_{ref}$. This reference oscillator $10_{ref}$ is associated with a frequency measurement device 3', which may be identical to the device 3. The device 3 thus provides a measurement of the resonant frequency $f_r$ as modified by the presence of the gas, whereas the device 3' provides a measurement of the resonant frequency unaffected by the presence of the gas. This latter is noted $f_{ref}$ and was called reference frequency in the general part of this description. Then the difference $\Delta f_r = f_r - f_{ref}$ which is measured or calculated by the subtractor 31 can be put into the formula $C_{gas} = [3 \cdot Q \cdot N_x \cdot V_x / (4 \cdot \beta \cdot f_r)] \cdot \Delta f_r$, and provides a value for the concentration of the gas which is free of errors due to variations of external conditions.

It is understood that the invention can be reproduced by modifying or adapting secondary aspects thereof compared to the detailed description which was just provided. However, recall that compared to gas detectors which were known before the present invention and which also use the photo-acoustic effect, a gas detector according to the invention additionally has the feedback electrical branch 2 which leads to the resonator 1 in order to apply the excitation force $F_x$. It also additionally has the measurement branch 4 which is fed at input with the excitation signal produced by the feedback electrical branch 2. For such gas detector architecture, the invention then introduces the adjustable phase shifter 41 in the measurement branch, in order to tune the additional excitation force $F_{pa}$ into phase quadrature relative to the excitation force $F_x$.

The invention claimed is:

1. A gas detector comprising:
an electrical measurement circuit, said electrical measurement circuit comprising:
an electromechanical resonator;
a feedback electrical branch, having an input which is connected to a detection terminal of the resonator for receiving a response signal from said resonator, and an output which is connected to an excitation terminal of the resonator for applying an excitation force to said resonator, so that the resonator and the feedback electrical branch form at least a part of an oscillator operating at a resonant frequency;
a frequency measurement device, connected to the oscillator so as to measure the resonant frequency; and
a measurement branch, having an input connected to the output of the feedback electrical branch, and a modulation output configured for sending a modulation signal to an external device, depending on an excitation signal which exists at the output of the feedback electrical branch,
so that when the external device is configured for applying an additional excitation force to the resonator, in addition to the excitation force applied by the feedback electrical branch, then an offset of the resonant frequency, which is measured by the frequency measurement device and which results from the additional excitation force, constitutes a measurement of a parameter of the external device, and
wherein the measurement branch comprises an adjustable phase shifter which is arranged between the input and the modulation output of said measurement branch, so that a phase shift of the additional excitation force which is applied by the external device to the resonator is tunable, in order that said additional excitation force is in phase quadrature relative to the excitation force which is applied by the feedback electric branch (2); and
a modulatable laser which constitutes the external device, with the modulation output of the measurement branch connected to a modulation input of the modulatable laser,
said modulatable laser being oriented so that a gas which would have an absorption line corresponding to a wavelength of the modulatable laser and which would receive a radiation beam originating from said modulatable laser, produces an acoustic wave and said acoustic wave produces the additional excitation force onto the resonator, so that the parameter which is measured by the offset of the resonant frequency is a concentration of the gas which has an absorption line at the wavelength of the modulatable laser.

2. The gas detector of claim 1, wherein the resonator is a vibrating quartz element or a vibrating silicon element.

3. The gas detector of claim 2, wherein the measurement branch is configured for reversibly applying an additional phase shift of pi, in additional to the phase shift which is tunable by means of the adjustable phase shifter, so that the offset of the resonant frequency which constitutes the measurement of the parameter of the external device is equal to half of a difference between two values which are measured for the resonant frequency with and without, respectively, the additional phase shift equal to pi.

4. The gas detector of claim 2, further comprising:
a reference electromechanical resonator; and
another feedback electrical branch, having an input connected to a detection terminal of the reference resonator for receiving a response signal from said reference resonator, and an output connected to an excitation terminal of the reference resonator for applying another excitation force to said reference resonator, so that the reference resonator and said another feedback electrical branch form a reference oscillator operating at another resonant frequency, called reference frequency, independently of the oscillator which is connected to the measurement branch;
and the measurement electrical circuit is further configured for measuring the reference frequency separately from the resonant frequency of the oscillator which is connected to the measurement branch, so that the offset of the resonant frequency which constitutes the measurement of the parameter of the external device corresponds to a difference between the resonant frequency which is measured for the oscillator connected to the measurement branch and the reference frequency.

5. The gas detector of claim 1, wherein the feedback electric branch comprises an amplifier and a phase shifter which are combined in series, or comprises a phase-locked loop assembly.

6. The gas detector of claim 5, wherein the measurement branch is configured for reversibly applying an additional phase shift of pi, in additional to the phase shift which is tunable by means of the adjustable phase shifter, so that the offset of the resonant frequency which constitutes the measurement of the parameter of the external device is equal to half of a difference between two values which are measured for the resonant frequency with and without, respectively, the additional phase shift equal to pi.

7. The gas detector of claim 5, further comprising:
a reference electromechanical resonator; and
another feedback electrical branch, having an input connected to a detection terminal of the reference resonator for receiving a response signal from said reference resonator, and an output connected to an excitation terminal of the reference resonator for applying another excitation force to said reference resonator, so that the reference resonator and said another feedback electrical branch form a reference oscillator operating at another resonant frequency, called reference frequency, independently of the oscillator which is connected to the measurement branch;
and the measurement electrical circuit is further configured for measuring the reference frequency separately from the resonant frequency of the oscillator which is connected to the measurement branch, so that the offset of the resonant frequency which constitutes the measurement of the parameter of the external device corresponds to a difference between the resonant frequency which is measured for the oscillator connected to the measurement branch and the reference frequency.

8. The gas detector of claim 1, wherein the measurement branch is configured for reversibly applying an additional phase shift of pi, in additional to the phase shift which is tunable by means of the adjustable phase shifter, so that the offset of the resonant frequency which constitutes the measurement of the parameter of the external device is equal to half of a difference between two values which are measured for the resonant frequency with and without, respectively, the additional phase shift equal to pi.

9. The gas detector of claim 1, further comprising:
a reference electromechanical resonator; and
another feedback electrical branch, having an input connected to a detection terminal of the reference resonator for receiving a response signal from said reference resonator, and an output connected to an excitation terminal of the reference resonator for applying another excitation force to said reference resonator, so that the reference resonator and said another feedback electrical branch form a reference oscillator operating at another resonant frequency, called reference frequency, independently of the oscillator which is connected to the measurement branch; and
the measurement electrical circuit is further configured for measuring the reference frequency separately from the resonant frequency of the oscillator which is connected to the measurement branch, so that the offset of the resonant frequency which constitutes the measurement of the parameter of the external device corresponds to a difference between the resonant frequency which is measured for the oscillator connected to the measurement branch and the reference frequency.

10. The gas detector according to claim 1, wherein the modulatable laser is modulatable in wavelength or radiation power for the radiation beam which originates from said modulatable laser.

11. The gas detector according to claim 1, wherein the resonator comprises a tuning fork, and the modulatable laser is oriented so that the radiation beam which originates from said modulatable laser is perpendicular to two tines of the tuning fork, and passes between the two tines of the tuning fork in a plane of symmetry of said tuning fork, or passes on one side of one of the two tines of the tuning fork which is opposite from the other tine.

12. The gas detector of claim 1, wherein the feedback electric branch comprises an amplifier and a phase shifter which are combined in series.

13. The gas detector of claim 1, wherein the resonator is a quartz tuning fork.

14. The gas detector of claim 1, wherein the resonator is a silicon tuning fork.

15. The gas detector of claim 1, wherein the feedback electric branch comprises a phase-locked loop assembly.

16. A method for measurement of a concentration of a gas, comprising the following steps:
/1/ selecting a gas detector which complies with claim 1, and for which a wavelength of the modulatable laser corresponds to an absorption line of the gas;
/2/ placing the gas detector so that the radiation beam which originates from the modulatable laser passes through a zone which could contain a quantity of the gas;
/3/ adjusting the adjustable phase shifter of the measurement branch, so that the additional excitation force applied by the external device to the resonator is in phase quadrature relative to the excitation force which is applied by the feedback electrical branch;
/4/ measuring an offset of the resonant frequency of the oscillator, resulting from the additional excitation force; and
/5/ deducing a value of the gas concentration from the measured offset of the resonant frequency.

17. The method according to claim 16, wherein the value of the gas concentration is deduced from the offset of the resonant frequency, in step /5/ by using the formula:

$$C_{gas} = [3 \cdot Q \cdot N_x \cdot V_x / (4 \cdot \beta \cdot f_r)] \cdot \Delta f_r$$

where $Q$ and $f_r$ are respectively a quality factor and a vibrational resonant frequency of the electromechanical resonator, $N_x$ is a peizoelectric conversion factor of said electromechanical resonator, $V_x$ is an excitation voltage amplitude of said electromagnetic resonator, and $\beta$ is a constant number which is independent of the concentration of the gas.

18. The method according to claim 16, wherein step /3/ comprises the following sub-steps:
measuring in real time a frequency of the oscillator during an operation of the gas detector; and
setting the adjustable phase shifter of the measurement branch so that said frequency of the oscillator as measured is maximum.

19. The method according to claim 16, wherein the resonator comprises a tuning fork, and wherin the adjustable phase shifter is set in step /3/ to produce a phase shift which is equal to:

$$\frac{\pi}{2} - \text{Arctan}\,(2\pi f_r \tau_{V-T}) - \text{Arctan}\left(\frac{\int_{-\frac{l}{2}}^{\frac{l}{2}}\left[Y_0\left(\frac{2\pi f_r}{c}r_{in}\right) - Y_0\left(\frac{2\pi f_r}{c}r_{ext}\right)\right]dz}{\int_{-\frac{l}{2}}^{\frac{l}{2}}\left[J_0\left(\frac{2\pi f_r}{c}r_{in}\right) - J_0\left(\frac{2\pi f_r}{c}r_{ext}\right)\right]dz}\right)$$

where $r_{in} = \left[\left(\frac{L}{2}\right)^2 + (z-H)^2\right]^{\frac{1}{2}}$ and $r_{ext} = \left[\left(\frac{L}{2}+e\right)^2 + (z-H)^2\right]^{\frac{1}{2}}$ where Oz is an axis parallel to a longitudinal direction of tines of the tuning fork with an origin which is located at a base of the tines, H is a first distance measured parallel to the axis Oz between the base of the tines of the tuning fork and a center of the radiation beam which originates from the modulatable laser, L is a second distance measured perpendicularly to the Oz axis between said center of the radiation beam and the tuning fork, e is a thickness of the tines of the tuning fork measured parallel to the second distance L, c is a propagation speed of sound in the gas, $f_r$ is the vibrational resonant frequency of the electromechanical resonator, $\tau_{V\text{-}T}$ is a relaxation time of the gas, and $J_o$ and $Y_o$ first-order Bessel functions of respectively the first and second kind.

* * * * *